(12) United States Patent
Shizuno

(10) Patent No.: US 6,188,133 B1
(45) Date of Patent: Feb. 13, 2001

(54) SEMICONDUCTOR WITH PLURALITY OF CONNECTING PARTS ARRANGED ON LOWER SURFACE OF A SUBSTRATE

(75) Inventor: Yoshinori Shizuno, Tokyo (JP)

(73) Assignee: Oki Electric Industry Co. Ltd., Tokyo (JP)

( * ) Notice: Under 35 U.S.C. 154(b), the term of this patent shall be extended for 0 days.

(21) Appl. No.: 09/222,867

(22) Filed: Dec. 30, 1998

(30) Foreign Application Priority Data

Jun. 26, 1998 (JP) .................................................. 10-180624

(51) Int. Cl.[7] ........................... H01L 23/48; H01L 23/52; H01L 23/40

(52) U.S. Cl. .................. 257/734; 257/685; 257/723; 257/724; 257/775; 257/774; 257/773; 257/780; 257/778; 438/638; 365/63

(58) Field of Search ..................................... 257/775, 774, 257/773, 778, 780, 784, 738, 723, 724, 734, 685; 438/638; 365/63

(56) References Cited

U.S. PATENT DOCUMENTS

| 5,216,278 | 6/1993 | Lin et al. . | |
|---|---|---|---|
| 5,252,854 | * 10/1993 | Arita et al. | 257/676 |
| 5,798,571 | * 8/1998 | Nakajima | 257/784 |
| 5,994,166 | * 11/1999 | Akram et al. | 438/108 |

FOREIGN PATENT DOCUMENTS

| 7-302858 | 11/1995 | (JP) . |
| 9-022977 | 1/1997 | (JP) . |
| 9-223861 | 8/1997 | (JP) . |

* cited by examiner

Primary Examiner—Steven H. Loke
Assistant Examiner—Luan Thai
(74) Attorney, Agent, or Firm—Rabin & Champagne, P.C.

(57) ABSTRACT

Electrical devices such as a plurality of semiconductor devices are mounted so as to be linearly symmetrical with respect to each other on an external substrate, with wiring from a semiconductor chip to first and second pads arranged in such a manner that signals outputted from the semiconductor chip arranged on an upper surface of a substrate reach the first and second pads arranged near two opposing sides of the lower surface of the substrate at substantially the same time.

23 Claims, 4 Drawing Sheets

SEMICONDUCTOR WITH PLURALITY OF CONNECTING PARTS ARRANGED ON LOWER SURFACE OF A SUBSTRATE

BACKGROUND OF THE INVENTION

1. Field of the Invention

The present invention relates to laying out of wiring for electrical devices such as semiconductors where electrical elements such as semiconductor elements are mounted on an upper surface of a substrate and a plurality of connectors for connecting with an external substrate are formed on a lower surface of a substrate.

2. Description of Related Art

In recent years, packages equipped with various package structures have been put forward in accompaniment to high-density packaging of electronic equipment such as semiconductor devices, etc.

This kind of technology is disclosed in, for example, U.S. Pat. No. 5,216278 registered on Jun. 1, 1993, Japanese Patent Laid-open Publication No. Hei. 7-302858 laid-open on Nov. 14, 1995, Japanese Patent Laid-open Publication No. Hei. 9-22977 laid-open on Jan. 21, 1997 and Japanese Patent Laid-open Publication No. Hei. 9-223861 laid-open on Aug. 26, 1997.

In addition to where a single semiconductor device and an external device are used in combination, this kind of semiconductor device also has applications where a plurality of semiconductor devices having the same function are mounted on an external substrate and used as a single electronic device.

For example, a plurality of Dynamic Random Access Memory (DRAM) mounted on a Single In-line Memory Module (SIMM) or Dual In-line Memory Module (DIMM) or a plurality of LCD drivers mounted on an LCD driver substrate are well known.

When a plurality of semiconductor devices, where electrical elements such as semiconductor elements are mounted on an upper surface of a substrate and a plurality of connectors for electrically connecting with an external substrate are formed on the lower surface of this substrate, are mounted on an external substrate, the following problems occur.

When semiconductor devices X and Y having the same functions are mounted on the external substrate 200 as shown in FIG. 2, the distance traversed by wiring 202 across a terminal x1 for outputting a signal for the semiconductor device X and an output terminal 201 of the external substrate 200 and the distance traversed by wiring 202 across a terminal y1 outputting a signal of the semiconductor device Y and an output terminal 201 is substantially different. This is also the case when the semiconductor device Y is rotated by 180 degrees as shown in FIG. 3.

The terminals x1 and x2 are arranged at the lower surface of the semiconductors X and Y and in reality these terminals cannot be viewed from above. However, these terminals are expressed schematically in the drawings as dotted lines for ease of understanding.

This difference in distance becomes a much more serious problem as the semiconductor device is operated at higher speeds. Namely, time for transmitting signals from the semiconductor X to the external terminal 201 and the time for transmitting signals from the semiconductor Y to the external terminal 201 is different, and the timing of signals appearing at the external terminal 201 becomes different. This also influences the operating speed of the whole of the electrical equipment on which the external substrate is mounted and makes design of the electrical equipment and setting of timing extremely difficult.

For example, if a personal computer, etc., mounted with SIMMs is assumed, this can easily be understood.

The use of two types of substrates having linearly symmetrical relationships has been considered for resolving this point. However, operating speeds between semiconductor devices become different because the length of the wiring connecting the substrate and the semiconductor elements is different within each semiconductor device.

Further, in addition to these two types of substrates, the use of two types of semiconductor elements having a linearly symmetrical relationship has also been considered. The use of this kind of configuration means that electrical characteristics of both devices can be considered to be the same but also means prohibitive increases in costs.

When a large number of like terminals of each semiconductor are connected using respective wiring, if laying out for each item of wiring is simply carried out, there is the possibility that intersections and short circuits may occur between wiring. Arrangements where each length of wiring is made to take a convoluted path in order to prevent intersections and short circuits have also been considered but this arrangement causes each length of wiring to become longer.

SUMMARY OF THE INVENTION

The object of the present invention is to provide an electrical device such as a semiconductor device compatible with high-speed operation.

A further object of the present invention is to provide an electrical device such as a plurality of semiconductor devices etc. mounted in a linearly symmetrical manner on an external substrate at a low price.

A still further object of the present invention is to provide a circuit substrate that dramatically increases the degree of freedom in design of the external substrate.

In order to achieve this object, in a typical aspect of the present invention, wiring from a semiconductor chip to first and second pads is arranged in such a manner that signals outputted from electrical elements such as semiconductor chips etc. arranged on the upper surface of a substrate reach the first and second pads arranged near two opposite sides of the lower surface of the substrate at substantially the same time.

This configuration is capable of providing devices compatible with high-speed operation at a low price.

BRIEF DESCRIPTION OF THE DRAWINGS

While the specification concludes with claims particularly pointing out the subject matter which is regarded as the invention, it is believed that the objects and features of the invention and further objects, features and actions will be better understood from the following description taken in connection with the accompanying drawings in which:

DETAILED DESCRIPTION OF THE PREFERRED EMBODIMENTS

First Embodiment

The following is a description with reference to the drawings of the embodiments of the present invention. In the following, a description is given centering on portions directly relating to the present invention, with descriptions being omitted for other portions. Omitted portions can easily be understood by referring to the above publications.

First, an example of a semiconductor device to which the present invention is applied is introduced. In the following description, an example is shown of a Ball Grid Array where connectors for connecting with an external substrate are configured from a metal layer of ball shapes.

As becomes clear from the following description, rather than just being applied to a ball grid array structure, the present invention can also be applied to semiconductor devices of various structures such as Chip Size Packages where the surface area of the package is close to that of an internally mounted semiconductor chip and Land Grid Arrays where connecting parts connecting with an external substrate are configured from a plate-shaped metal layer.

Figure 1:
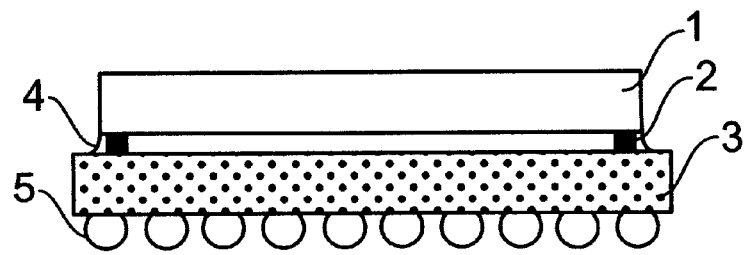
FIG. 1 is a cross-sectional view showing an embodiment of the present invention.

FIG. 1 shows a cross-sectional view of a ball grid array structure semiconductor device.

In FIG. 1, a so-called Flip-Chip method where a semiconductor chip and a substrate are connected via bump electrodes within a ball grid array structure semiconductor is shown.

A wire bonding method where a semiconductor chip and a substrate are connected via wires even within the same ball grid array structure semiconductor device also exists. This wire bonding method is also introduced in the above publications and can be easily understood with reference to these publications.

With the device of FIG. 1, a plurality of electrodes 2 are formed on the surface on which the circuit for a semiconductor chip 1 is formed. Electrical signals generated within the semiconductor chip 1 are then outputted to outside from prescribed electrodes of the electrodes 2. Electrical signals are then applied to other electrodes from outside.

A plurality of pads (not shown) are provided at the package substrate 3 (this substrate is formed taking a ceramic or organic substance as it's main material) at positions corresponding to the electrodes 2. Each electrode 2 and each pad are electrically connected. Methods of connecting by forming compounds between metal layers, connecting using an organic conductive paste and connecting using solder can be considered for carrying out this connecting. This connecting portion is sealed by a sealing material 4. This sealing prevents corrosion of connectors and wiring due to the penetration of water from outside. Each pad is connected via wiring and circuitry formed on and within the package substrate 3, to a plurality of ball-shaped connectors 5 formed on the lower surface of the substrate from solder. These ball-shaped connectors 5 are used for connecting with equipment such, as external substrates etc.

Figure 4A:
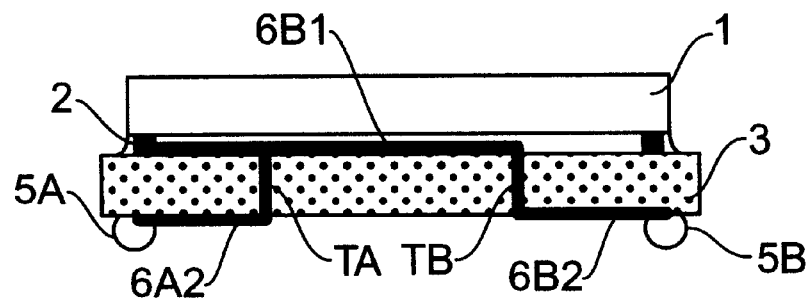
FIGS. 4A and 4B are respectively a partial cross-sectional and plan views of the embidiment of the present invention.
Figure 4B:
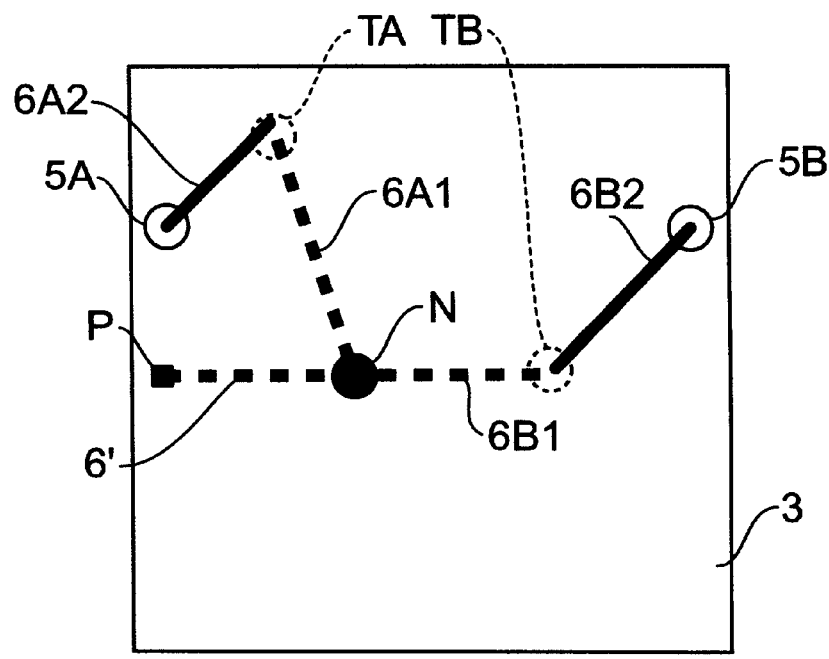
Figure 2:
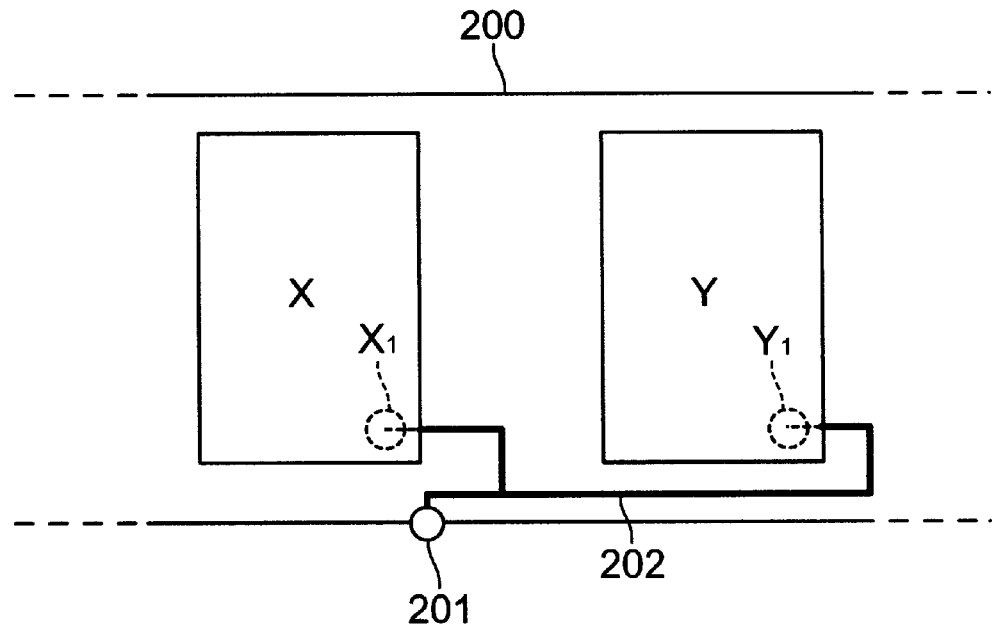
FIG. 2 is a view from above of an external substrate on which a related semiconductor device is mounted.
Figure 3:
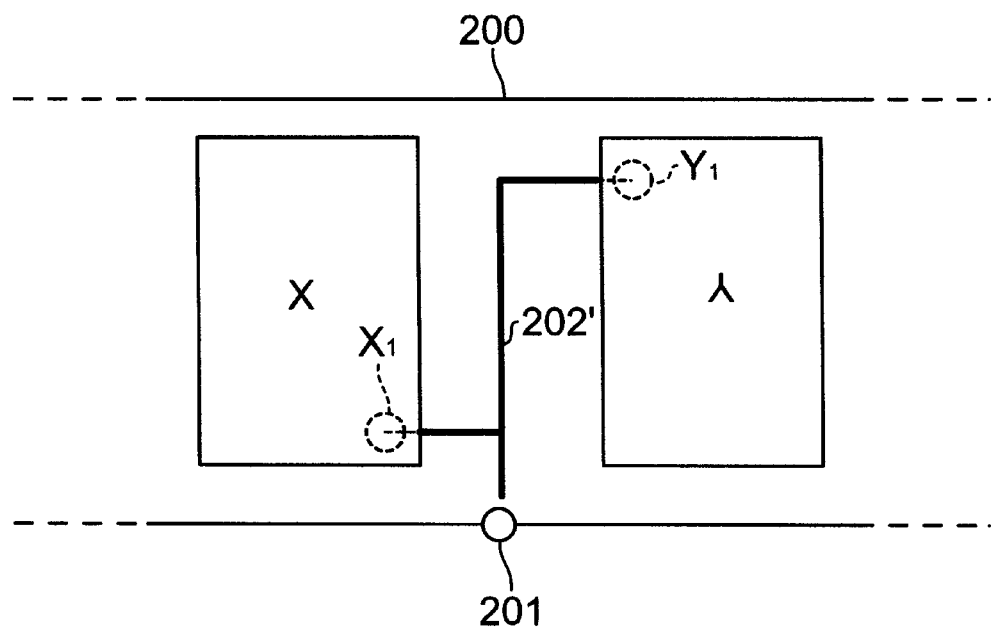
FIG. 3 is a view from above of an external substrate on which a related semiconductor device is mounted.

FIGS. 4A and 4B are schematic views of a first embodiment of the device in FIG. 1. to which the present invention is applied. In particular, FIGS. 4A and 4B are a cross-sectional view of this example and a plan view of the lower surface of the substrate. In order to make this description easy to understand just two connectors 5A and 5B are shown for the ball-shaped connectors but in reality a large number of ball-shaped connectors are arranged in an array-shape (not shown). This array is disclosed in the aforementioned publications.

In this embodiment, the pads P connected to the electrodes 2 arranged at the surface of the package substrate 3 and the connectors 5A and 5B arranged on the lower surface-of the package substrate 3 are connected by wiring. In the drawings, the wiring arranged at the substrate surface is expressed schematically as dotted lines for ease of understanding.

This wiring consists of common wiring 6' from the pad P to the node N and branch wiring branching from the node N. This branch wiring consists of first branch wiring and second branch wiring.

The first branch wiring comprises wiring 6A1 for connecting the node N and the through hole TA provided within the package substrate 3 and wiring 6A2 for connecting the through hole TA and the connector 5A. The wiring 6A1 is formed on the upper surface of the package substrate 3 and the wiring 6A2 is formed on the lower surface of the package substrate 3. Refer to the aforementioned publications for this forming method.

The through hole TA is constructed in such a manner as to be conductive. For example, as shown in the above publications, conductivity can be provided by forming a metal film layer using plating the inner surface thereof. The through hole is not limited to being plated, and other methods can be adopted providing the configuration is conductive, i.e. the configuration for electrically connecting wiring formed on the substrate surface and wiring formed on the substrate lower surface can be selected as appropriate by the designer.

The second branch wiring consists of wiring 6B1 for connecting the node N and the through hole TB provided within the package substrate 3 and wiring 6B2 for connecting the through hole. TB and the connector 5B. The wiring 6B1 is formed on the upper surface of the package substrate 3 and the wiring 6B2 is formed on the lower surface of the package substrate 3. The methods for forming the wiring and the through holes can be referenced from the above publications.

In this embodiment the connectors 5A and 5B are arranged in linearly symmetrical positions on the lower surface of the package 3. The electrical characteristics of the wiring from the pad P to the connectors 5A and 5B are substantially the same.

The electrical characteristics being the same means that electrical signals applied to the pad P from electrode 2 are simultaneously transmitted to the connectors 5A and 5B or that the signals applied to the connectors 5A and 5B simultaneously reach the pad P.

In this embodiment the positions of the through holes TA and TB and the node N are decided in such a manner that the signal applied to the pad P is simultaneously transmitted to the connectors 5A and 5B.

In this embodiment, wiring 6A1, 6A2, 6B1 and 6B2 is formed of the same material while using wiring of the same width. Further, the positions of the through holes TA and TB and the node N are decided in such a manner that the length of the wiring from pad P to the connectors 5A and 5B (in this case, the length from the node N to the connectors 5A and 5B) is the same in order that the electrical resistance between the pad P and the connector 5A and the electrical resistance between the pad P and the connector 5B is the same.

The pad P and the connector 5A are positioned close to each other with respect to three dimensions but are connected via a through hole TA positioned away from the pad P.

Here, an example is shown that takes into consideration resistance due to the length of wiring using the positions of the through holes and the nodes. The electrical characteristics of wiring from the pads to each connector can also be made to coincide by adjusting the width of wiring from pads to each of the connectors and the wiring material.

The electrical characteristics of each item of wiring can be made to coincide by taking into consideration just one of the length of the wiring, width of the wiring, material of the wiring and inter-wiring capacitances formed across neighboring wires, but it is also possible to make the electrical characteristics coincide while combining a plurality of these elements. This selection is achieved by a designer selecting the optimum combination of elements while considering the design situation of the problem of space for forming through holes on the substrate and the problem of space for forming wire, etc.

Figure 5:
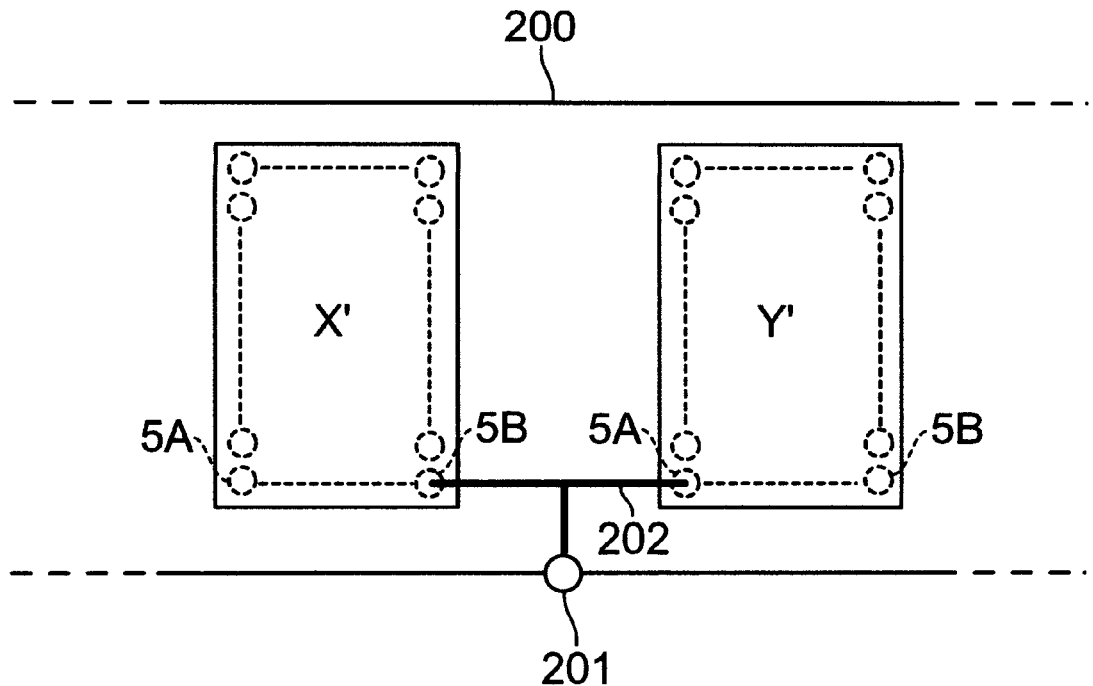
FIG. 5 is a view from above of an external substrate on which the semiconductor device of the present invention is mounted.
Figure 6:
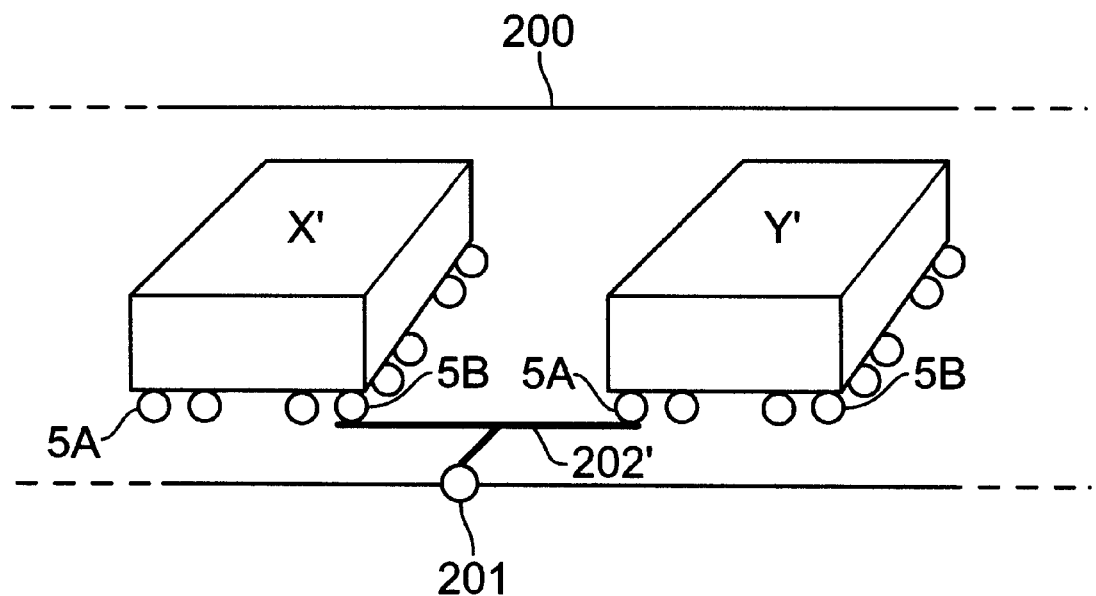
FIG. 6 is an oblique view of an external substrate on which the semiconductor device of the present invention is mounted.

An example where a plurality of semiconductor devices of this embodiment are mounted on an external substrate 200 is shown in FIG. 5 and FIG. 6. FIG. 5 is a plan view showing the appearance of semiconductor devices X*and Y*of this embodiment mounted on the external substrate 200 and FIG. 6 shows an oblique view of the same.

In the embodiment shown in FIG. 5 and FIG. 6 connectors 5A and 5B to which the same signal is applied are provided at semiconductors X* and Y*respectively. A terminal 201 of the external substrate 200 and the connectors 5A and 5B can then be connected via the shortest distance along the wiring 202' on the external substrate 200 without having to follow convoluted paths about the external substrate 200.

The design is such that signals outputted from the semiconductor chip simultaneously reach the connectors 5A and 5B. Signals are then outputted from the semiconductor devices X* and Y* with substantially the same timing.

This is preferable from the point of view of the high speed semiconductor devices and the speed of inputting and outputting between external equipment and the semiconductor devices. Further, outputting signals from each semiconductor device with exactly the same timing is extremely simple when designing mounting of the semiconductor devices on an external substrate. This means that the time the designer spends taking into consideration the timing of signals from each individual semiconductor device and the convolution of the wiring is dramatically reduced.

Cost can also therefore be dramatically reduced because linearly symmetrical semiconductor devices can be realized on one type of package substrate.

When the semiconductor device of this embodiment is mounted on an external substrate, dummy pads corresponding to connectors that are not connected with wiring on the external substrate (i.e. connector 5A of the semiconductor device X* and the connector 5B of the semiconductor device Y*) are provided on the external substrate. These dummy pads are provided in an electrically independent manner on the external substrate and bear no relation to the operation of the electrical equipment.

A method can also be considered where only connectors that are not connected using wiring on the external substrate are not formed (connector 5A of the semiconductor device X* and connector 5B of the semiconductor device Y*) while forming the large number of ball-shaped connectors. In this case, two types of package substrate are required with this connector arrangement.

According to the above form, a superior electrical device, such as a semiconductor device, etc., compatible with high-speed operation, can be provided at a low cost.

Therefore, in this embodiment, a semiconductor device can be configured from two types of package substrate including (1) package substrate 3* formed with common wiring 6* from the pad P to the node N, wiring 6A1 connecting the node N and the through-hole TA and wiring 6A2 connecting the through hole TA and the connector 5A, and (2) a package substrate 3** formed with common wiring 6* from the pad P to the node N, wiring 6A1 connecting the node N and the through hole TB, and wiring 6B2 connecting the through hole TB and the connector 5B. These semiconductor devices can be arranged the same as in FIG. 5 and FIG. 6. In this case, two package substrates are required.

As signals are also outputted with exactly the same timing from each of the semiconductor devices in this case also, effects such as great simplification of design during mounting of the semiconductor devices on the external substrate can be obtained.

Figure 7A:
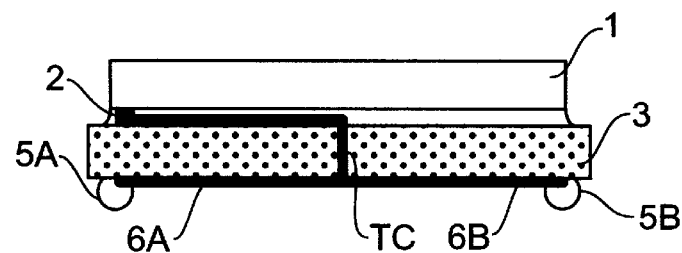
FIGS. 7A and 7B are respectively partial cross-sectional and plan views of a further embodiment of the present invention.
Figure 7B:
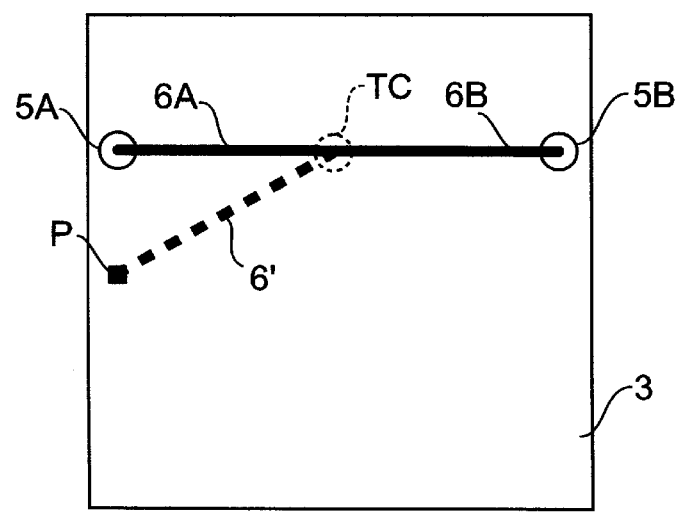

Next, a further embodiment of the present invention is described with reference to FIGS. 7A and 7B. As the same numerals are given to elements that are the same as for previous portions their descriptions are omitted.

In this embodiment also, the pad P connected to the electrode 2 arranged on the surface of the package substrate 3, and the connectors 5A and 5B arranged on the lower surface of the package substrate 3, are connected using wiring. Wiring arranged on the upper substrate surface in FIG. 7A is expressed schematically in FIG. 7B using dotted lines for ease of understanding.

This wiring consists of common wiring 6' for connecting the pad P and the through hole TC, wiring 6A for connecting the through hole TC and the connector 5A, and wiring 6B for connecting the through hole TC and the connector 5B. The wiring 6A and 6B is formed on the lower surface of the package substrate 3 and the wiring 6* is formed on the upper surface of the package substrate 3.

The through hole TA is configured in such a manner as to have conductivity in the same way as the above through hole.

In this embodiment, the connectors 5A and 5B, are arranged in linearly symmetrical positions on the lower surface of this package 3. The electrical characteristics of wiring from the pad P to the connectors 5A and 5B are substantially the same and the through hole TC is formed at a position that is equal distances from the connectors 5A and 5B.

Here, an example is shown taking into consideration the resistance due to the length of wiring from the position of the through hole. As in the above, the electrical characteristics of the wiring from the pads to each connector can be made to further coincide by adjusting the width of the wiring from the pads to each of the connectors and adjusting the wiring material.

The degree to which the electrical characteristics of the wiring coincide can be further raised by considering a plurality of combinations of the above described elements of the length of the wiring, wiring width, wiring material and wiring capacitances formed between neighboring wires in this embodiment.

The designer then selects the most suitable combination of elements while considering the convenience of design of the substrate.

In this embodiment, a semiconductor device is configured from two types of package substrate, including (1) a package substrate 3* formed with wiring 6* for connecting a pad P and a through hole TC, and wiring 6A for connecting the through hole TC and the connector 5A, and (2) a package 3** formed with wiring 6* for connecting the pad P and the through hole TC and wiring 6B for connecting the through hole TC and the connector 5B. These semiconductor devices are arranged as in FIG. 5 and FIG. 6. In this case, two types of package substrate are required.

In this case also signals are outputted from each of the semiconductor devices with exactly the same timing, with the result that the design for mounting this semiconductor device on an external substrate is dramatically simplified.

According to this embodiment, in addition to the various effects obtained in the above embodiments, the effect that the design will be further simplified is also anticipated. Namely, by positioning the through hole in such a manner as to be positioned at the same distance from two connectors, this position can be specified in a comparatively easy manner.

Figure 8:
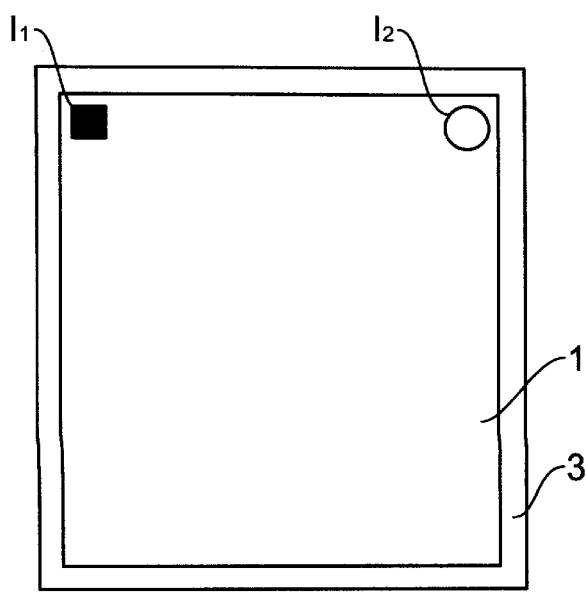
FIG. 8 is a plan view showing identifying marks of the present invention.

With the semiconductor device of the above embodiments, identifying marks I1 and I2 of different shapes can be provided as shown in FIG. 8. These marks indicate the orientation of the linearly symmetrical semiconductor devices and are designed with different shapes and colors, etc. Marks can be provided on the semiconductor chip 1 or on the package substrates.

The orientation of semiconductor devices can then be easily understood when mounting semiconductor devices on an external substrate.

The present invention is described using exemplifying embodiments but the present invention is by no means limited in this respect. Various modifications of the exemplifying embodiments and further embodiments of the present invention can also be understood by a fellow manufacturer by referring to this description. It is therefore considered that all modifications and embodiments of the present invention are covered by the scope of the patent claims.

What is claimed is:

1. A semiconductor device equipped with a semiconductor chip having a plurality of electrodes for outputting electrical signals to outside, and a substrate having an upper surface, and having a lower surface on an opposite side to the upper surface, with the semiconductor chip being mounted on the upper surface, a plurality of connectors, including a first connector and a second connector, for electrically connecting with an external substrate, being arranged in an array on the lower surface, and the substrate being formed with wiring for electrically connecting the plurality of electrodes of the semiconductor chip and the plurality of connectors, wherein the wiring is arranged in such a manner that a signal outputted from one electrode of the plurality of electrodes is transmitted to both the first connector and the second connector at substantially the same time.

2. The semiconductor device of claim 1, wherein said wiring comprises first wiring connected to the one electrode, formed on the upper surface of the substrate, second wiring connected to the first and second connectors, formed on the lower surface of the substrate, and through hole wiring, formed within the substrate for connecting the first wiring and second wiring.

3. The semiconductor device of claim 2, wherein the through hole wiring is positioned in such a manner that distances to the first and second connectors are the same.

4. The semiconductor device of claim 2, wherein the through hole wiring comprises first and second through hole wiring formed at different distances from the prescribed electrodes, and wherein the second wiring comprises third wiring connecting from the first through hole wiring to the first connector, and fourth wiring connecting from the second through hole wiring to the second connector, with the third wiring and the fourth wiring being of different lengths and thicknesses.

5. The semiconductor device of claim 4, wherein the plurality of connectors include ball-shaped or plate-shaped conductors.

6. A semiconductor device unit with two semiconductor devices of claim 1 mounted on an external substrate, wherein the first connector of one semiconductor device is connected to the second connector of the remaining semiconductor device.

7. The semiconductor device unit of claim 6, wherein identifying marks for identifying device orientation are provided on the semiconductor devices.

8. The semiconductor device unit of claim 6, wherein electrically independent dummy pads are provided on the external substrate in such a manner as to correspond to the second connector of the one semiconductor device and the first connector of the remaining semiconductor device.

9. The semiconductor device of claim 6, wherein the plurality of connectors include ball-shaped conductors and the ball-shaped conductors are not formed at the second connector of the one semiconductor device and the first connector of the remaining semiconductor device.

10. An electrical device unit, comprising:

an electrical device including electrical elements having electrodes for outputting electrical signals, a package substrate, the electrical device being disposed with the electrical elements mounted on an upper surface of the package substrate, a first pad and a second pad for electrically connecting with an external substrate, provided on two opposing sides of a lower surface thereof, and wiring electrically connecting the electrodes and the first and second pads, wherein the wiring is laid out in such a manner that a signal outputted from one electrode of the electrodes reaches both the first pad and the second pad at substantially the same time.

11. The electrical device unit of claim 10, wherein the wiring comprises first wiring connected to the one electrode, formed on the upper surface of the package substrate, second wiring connected to the first and second pads, formed on the lower surface of the package substrate, and through hole wiring formed within the package substrate, for connecting the first wiring and the second wiring.

12. The electrical device unit of claim 11, wherein the through hole wiring is positioned in such a manner that distances from the through hole wiring to the first and second pads are the same.

13. The electrical device unit of claim 11, wherein the through hole wiring comprises first and second through hole wiring formed at different distances from the one electrode, the second wiring comprises third wiring connecting from the first through hole wiring to the first pad and fourth wiring connecting from the second through hole wiring to the second pad, with the third wiring and the fourth wiring being of different lengths and thicknesses.

14. The electrical device unit of claim 11, wherein the pads are formed in the shapes of balls or in the shapes of flat metal layers.

15. An electrical device unit, wherein two of the electrical device units of claim 10 are mounted on an external substrate, with the first pad of one of the electrical devices and the second pad of the remaining electrical device being connected.

16. The electrical device unit of claim 15, wherein identifying marks for identifying orientation of the devices are provided at the electrical device of claim 15.

17. The electrical device unit of claim 15, wherein electrically independent dummy pads are provided on the external substrate in such a manner as to correspond to the second pad of the one electrical device and the first pad of the remaining electrical device.

18. The electrical device unit of claim 15, wherein the pads are formed in the shapes of balls or in the shapes of flat metal layers, and the metal layers are not formed at the second pad of the one electrical device and the first pad of the remaining electrical device.

19. A semiconductor device, including a semiconductor element having electrodes for outputting signals,
a package substrate with the semiconductor element mounted on an upper surface thereof,
first and second pads, arranged near two different sides of a lower surface of the package substrate, for connecting electrically with an external substrate, and
wiring for electrically connecting the electrodes and the first and second pads, wherein electrical resistance of wiring from one of the electrodes to the first pad and electrical resistance of wiring from the electrodes to the second pad are substantially the same and the wiring being arranged such that a signal outputted from the one electrode reaches both the first pad and the second pad at the same time.

20. The semiconductor device of claim 19, wherein the length and width of wiring from the one electrode to the first pad differ from the length and width of wiring from the one electrode to the second pad in order to make the electrical resistance substantially the same.

21. A circuit substrate with an upper surface capable of mounting thereto an electrical element having electrodes including one electrode for outputting a signal and a lower surface arranged with first and second pads in the vicinity of two different sides thereof for electrically connecting with an external substrate, and being formed with connecting wiring for electrically connecting the electrodes and the first and second pads, wherein electrical resistance of wiring from the one electrode to the first pad and electrical resistance of wiring from the one electrode to the second pad are substantially the same, and wherein the connecting wiring is arranged such that a signal outputted from the one electrode reaches both the first pad and the second pad at the same time.

22. The circuit substrate of claim 21, wherein the length and width of wiring from the one electrode to the first pad differ from the length and width of wiring from the electrodes to the second pad in order to make the electrical resistance substantially the same.

23. A semiconductor unit including first and second semiconductor devices positioned in a linearly symmetrical manner, each of the first and second semiconductor devices including
a semiconductor chip having a plurality of electrodes for outputting electrical signals to outside, and
a device substrate having an upper surface, and having a lower surface on an opposite side to said upper surface, with the semiconductor chip being mounted on the upper surface, and with a plurality of connectors in an array, including a first connector and a second connector, on the lower surface for electrically connecting with an external substrate; the device substrate being formed with wiring for electrically connecting the plurality of electrodes of the semiconductor chip and the plurality of connectors,
wherein the wiring for each of the first and second semiconductor devices is arranged in such a manner that
electrical characteristics between the pluralities connectors and electrodes of the first semiconductor device are substantially the same as the electrical characteristics between the pluralities of connectors and electrodes of the second semiconductor device,
the plurality of connectors of the first semiconductor device and the plurality of connectors of the second semiconductor device are positioned in a mutually linearly symmetrical manner and
in each of the first and second semiconductor devices, a signal outputted from one electrode of the plurality of electrodes thereof reaches both the first connector thereof and the second connector thereof at the same time.

* * * * *